United States Patent
Yang (10) Patent No.: US 10,103,725 B2
(45) Date of Patent: *Oct. 16, 2018

(54) DRIVING CIRCUIT OF A POWER CIRCUIT

(71) Applicant: Delta Electronics, Inc., Taoyuan (TW)

(72) Inventor: Chang-Jing Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/894,561

(22) Filed: Feb. 12, 2018

(65) Prior Publication Data
US 2018/0191245 A1    Jul. 5, 2018

Related U.S. Application Data

(63) Continuation-in-part of application No. 15/395,738, filed on Dec. 30, 2016, now Pat. No. 9,906,221.

(51) Int. Cl.
| | |
|---|---|
| *H02M 1/44* | (2007.01) |
| *H02M 3/158* | (2006.01) |
| *H03K 17/687* | (2006.01) |
| *H03K 17/16* | (2006.01) |
| *H02M 1/08* | (2006.01) |
| *H03F 3/45* | (2006.01) |
| *H02M 1/00* | (2006.01) |

(52) U.S. Cl.
CPC ............ *H03K 17/161* (2013.01); *H02M 1/08* (2013.01); *H02M 1/44* (2013.01); *H02M 3/1588* (2013.01); *H03F 3/45475* (2013.01); *H03K 17/6871* (2013.01); *H02M 2001/0006* (2013.01); *H03F 3/45* (2013.01); *H03K 2217/0063* (2013.01); *H03K 2217/0072* (2013.01); *H03K 2217/0081* (2013.01)

(58) Field of Classification Search
CPC ............. H03K 17/161; H03K 17/6871; H03K 2217/0063; H03K 2217/0072; H03K 2217/0081; H02M 1/08; H02M 1/44; H02M 3/158; H02M 3/1588; H02M 2001/0006

See application file for complete search history.

(56) References Cited

U.S. PATENT DOCUMENTS

| | | | |
|---|---|---|---|
| 6,885,225 B2 | 4/2005 | Ohmichi et al. | |
| 7,388,422 B2 * | 6/2008 | Khan | H02M 3/07 327/112 |

(Continued)

*Primary Examiner* — Patrick O'Neill
(74) *Attorney, Agent, or Firm* — Muncy, Geissler, Olds & Lowe, P.C.

(57) ABSTRACT

A power circuit includes a power transistor flowing a power current to a ground according to the voltage of a driving node, a driving circuit, and a pre-driver. The driving circuit includes a high-side transistor providing a supply voltage to the driving node according to a high-side voltage of a high-side node, a low-side transistor coupling the driving node to the ground according to a first internal signal, and a charge pump coupled to the high-side node and the driving node and generating the high-side voltage that exceeds the supply voltage according to the first internal signal. The pre-driver generates the first internal signal according to a control signal. The pre-driver is configured to improve driving capability of the control signal.

34 Claims, 10 Drawing Sheets

(56) References Cited

U.S. PATENT DOCUMENTS

| | | | |
|---|---|---|---|
| 8,766,711 B2* | 7/2014 | Takemae | H02M 3/155 |
| | | | 327/170 |
| 9,525,413 B2 | 12/2016 | Roberts et al. | |
| 9,765,749 B2* | 9/2017 | Miura | H02M 3/07 |
| 9,780,773 B2 | 10/2017 | Kawata et al. | |
| 9,906,221 B1* | 2/2018 | Yang | H03K 17/6871 |

* cited by examiner

DRIVING CIRCUIT OF A POWER CIRCUIT

CROSS REFERENCE TO RELATED APPLICATIONS

The present application is a continuation-in-part of and claims priority from U.S. patent application Ser. No. 15/395,738, filed Dec. 30, 2016, the content of which is hereby incorporated by reference in its entirety.

BACKGROUND OF THE INVENTION

Field of the Invention

The disclosure generally relates to a driving circuit integrated with a GaN power device.

Description of the Related Art

Figure 1:
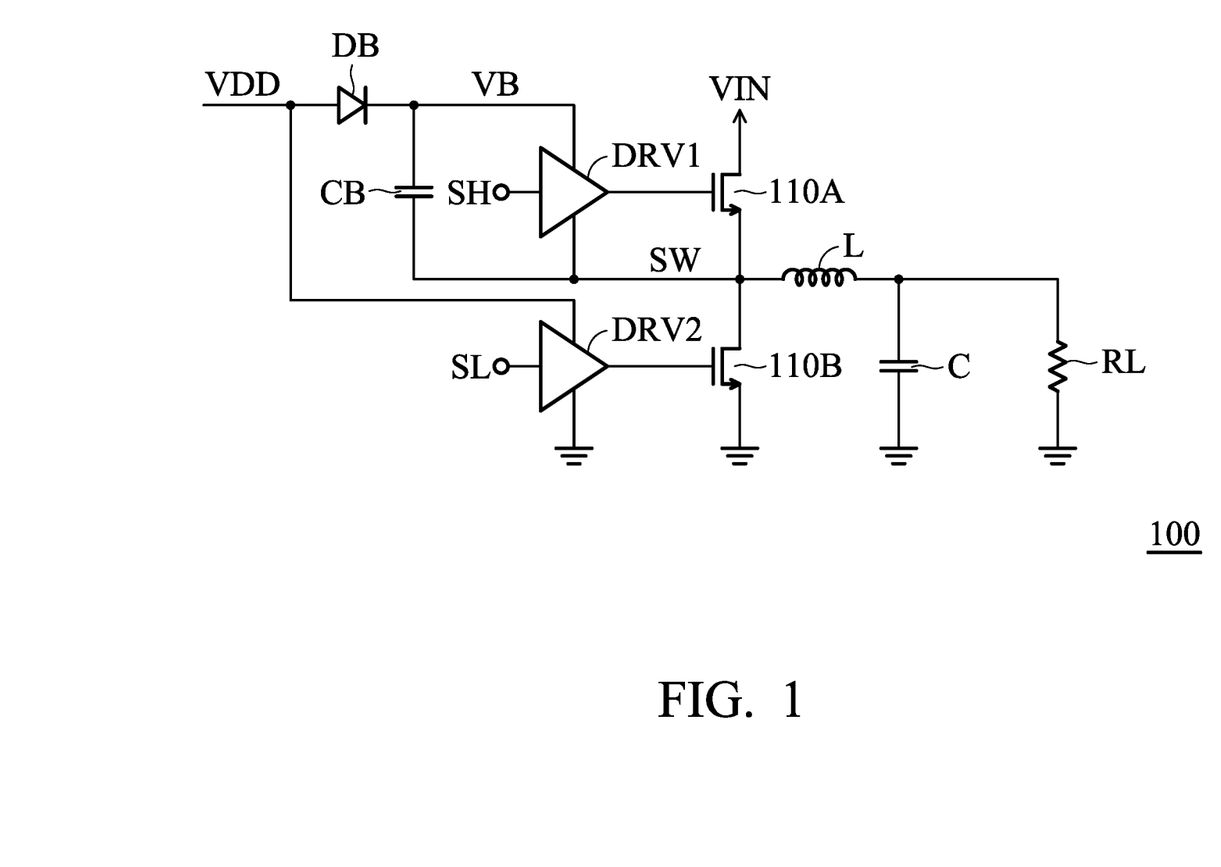
FIG. 1 illustrates a conventional power circuit.

In a power circuit, a charge pump is always required to boost the supply voltage to a higher voltage for driving the power transistor. FIG. 1 illustrates a conventional power circuit. As shown in FIG. 1, the high-side driver DRV1 is configured to drive the first power transistor 110A, and the low-side driver DRV2 is configured to drive the second power transistor 110B. In addition, the boost capacitor CB and the boost diode DB are configured to boost the supply voltage VDD to the boost voltage VB, such that the first power transistor 110A can be fully turned on. Therefore, the first power transistor 110A supplied by the input voltage VIN and the second power transistor 110B can drive the load device RL through the inductor L and the capacitor C.

Since the inductor L may induce significant parasitic effects at the switch node SW (such as a negative voltage spike generated at the switch node SW by the turned-on body diode of the second power transistor 110B), these parasitic effects can interfered with the boost voltage VB when the boost capacitor CB is charged through the power transistor. Therefore, it is necessary to eliminate parasitic effects from the driving circuit.

BRIEF SUMMARY OF THE INVENTION

For solving the problems described above, the invention provides a driving circuit with a charge pump that is not charged through the power transistor to mitigate parasitic effects.

In an embodiment, a power circuit comprises a power transistor, a driving circuit, and a pre-driver. The power transistor flows a power current to a ground according to a driving voltage of a driving node. The driving circuit comprises a high-side transistor, a low-side transistor, and a charge pump. The high-side transistor provides a supply voltage to the driving node according to a high-side voltage of a high-side node. The low-side transistor couples the driving node to the ground according to a first internal signal. The charge pump is coupled to the high-side node and the driving node, and is configured to generate the high-side voltage that exceeds the supply voltage according to the first internal signal. The pre-driver generates the first internal signal according to a control signal. The first pre-driver is configured to improve driving capability of the control signal.

In an embodiment, a driving circuit for driving a power transistor, which flows a power current to a ground according to a driving voltage of a driving node, comprises a high-side transistor, a low-side transistor, a charge pump, and a pre-driver. The high-side transistor provides a supply voltage to the driving node according to a high-side voltage of a high-side node. The low-side transistor couples the driving node to the ground according to a first internal signal. The charge pump is coupled to the high-side node and the driving node, and is configured to generate the high-side voltage that exceeds the supply voltage according to the first internal signal. The pre-driver generates the first internal signal according to a control signal. The first pre-driver is configured to improve driving capability of the control signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
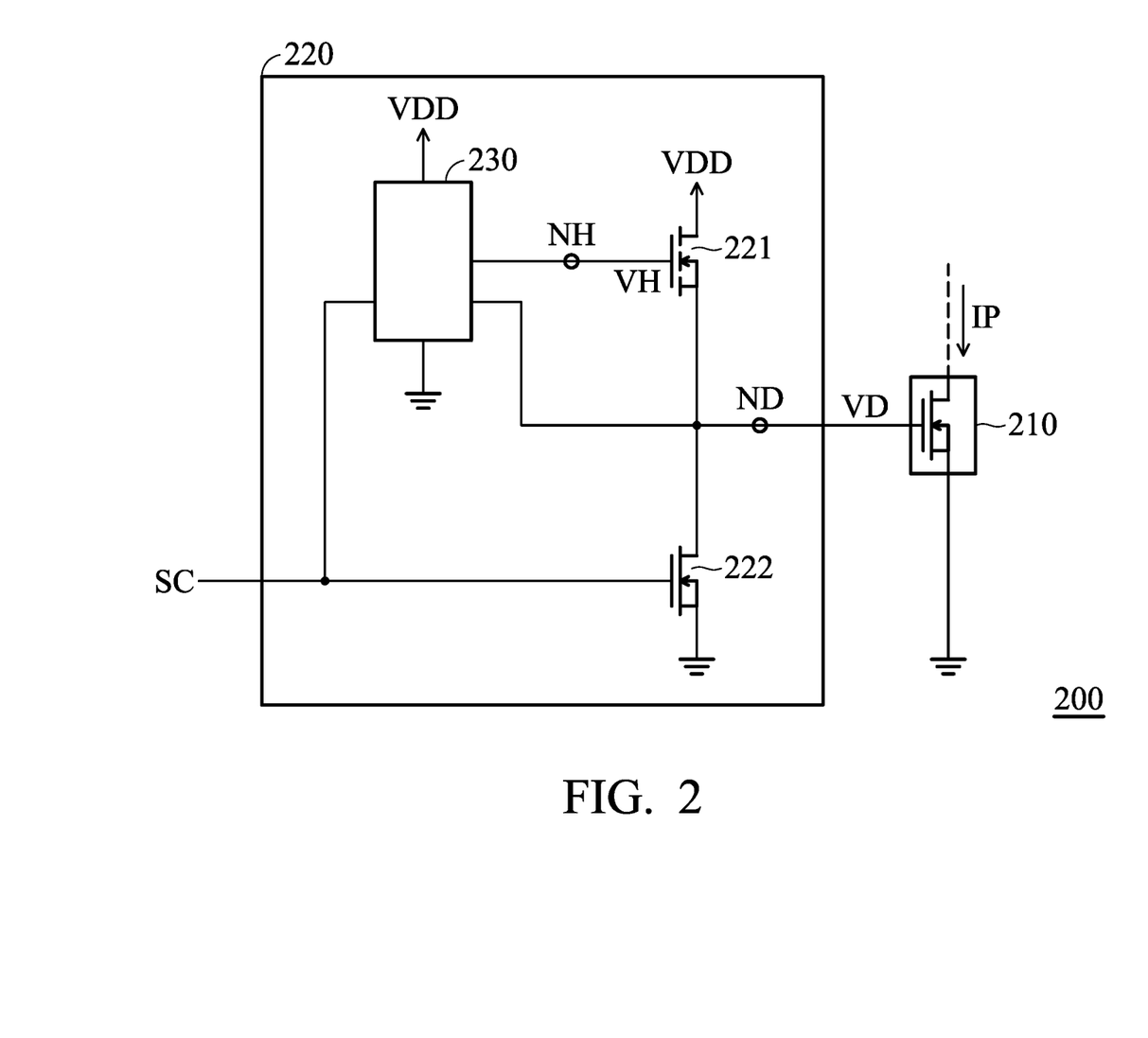
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 210 and a driving circuit 220. The power transistor 210 flows the power current IP to the ground according to the driving voltage VD of the driving node ND. According to an embodiment of the invention, the power transistor 210 is a GaN transistor.

The driving circuit 220 includes a high-side transistor 221, a low-side transistor 222, and a charge pump 230. The high-side transistor 221 supplies the supply voltage VDD to the driving node ND according to the high-side voltage VH of the high-side node NH. The low-side transistor 222 is coupled between the driving node ND and the ground, and configured to pull the driving voltage VD down to the ground according to the control signal SC. According to an embodiment of the invention, the high-side transistor 221 and the low-side transistor 222 are normally-off transistors.

The charge pump 230 is supplied by the supply voltage VDD and the ground and coupled to the high-side node NH and the driving node ND. For the sake of fully turning on the high-side transistor 221, the charge pump 230 is configured to generate the high-side voltage VH exceeding the supply voltage VDD, such that the gate-to-source voltage of the high-side transistor 221 at least exceeds the threshold voltage to apply the supply voltage VDD to the driving node ND. According to an embodiment of the invention, the driving circuit 220 is a rail-to-rail driver, such that the driving voltage VD ranges from the supply voltage VDD to the ground level.

Figure 3:
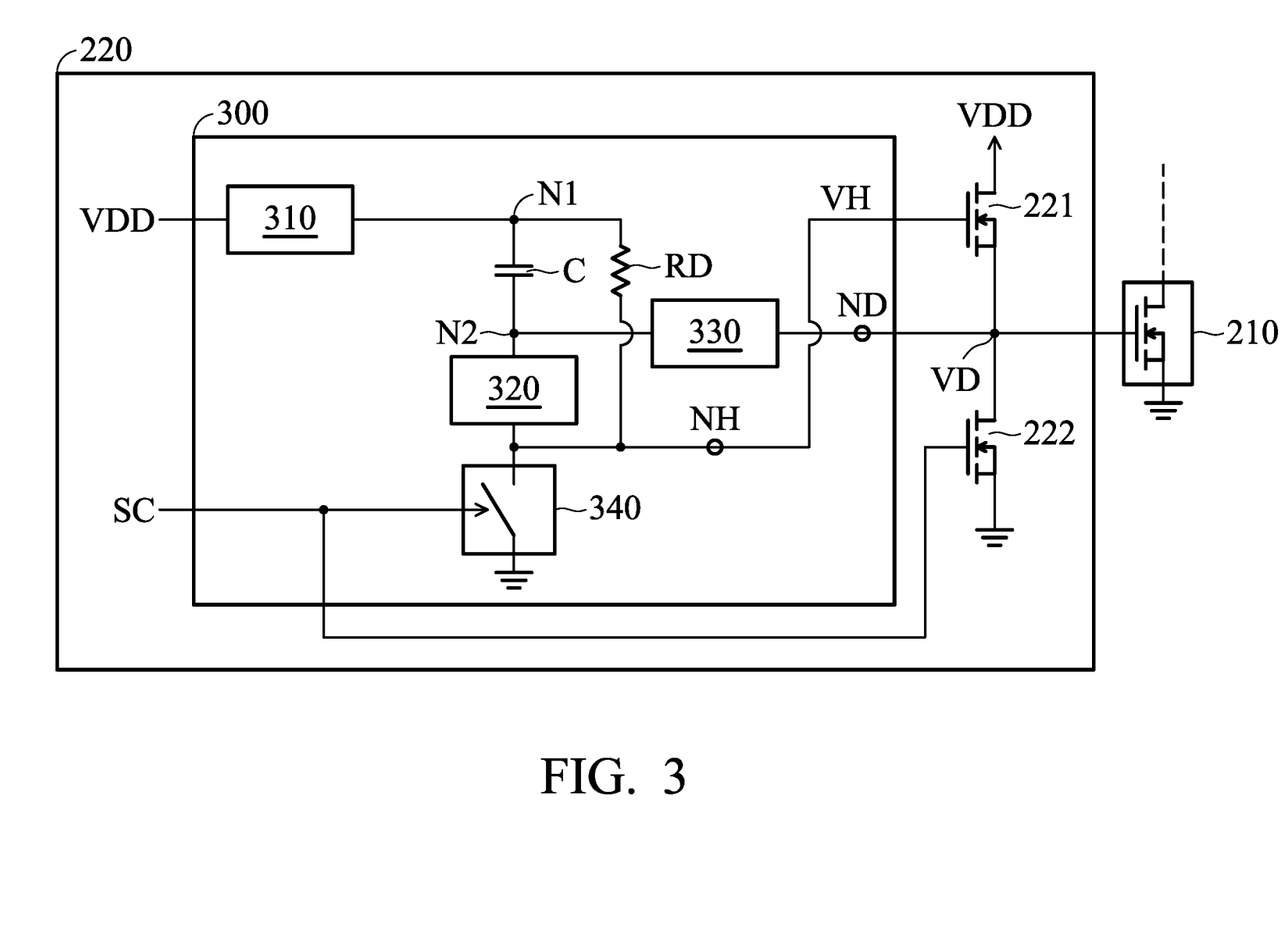
FIG. 3 shows a schematic diagram of the charge pump in the power circuit 200 of FIG. 2 in accordance with the invention.

FIG. 3 shows a schematic diagram of the charge pump in the power circuit 200 of FIG. 2 in accordance with the invention. As shown in FIG. 3, the charge pump 300, which is coupled to the driving node ND and the high-side node NH, includes a first unidirectional conducting device 310, a discharge resistor RD, a capacitor C, a second unidirectional conducting device 320, a third unidirectional conducting device 330, and a switch 340.

When the supply voltage VDD exceeds the voltage of the first node N1, the first unidirectional conducting device 310 is turned ON. When the voltage VDD does not exceed the voltage of the first node N1, the first unidirectional conducting device 310 is turned OFF. The capacitor C is coupled between the first node N1 and the second node N2. The discharge resistor RD is coupled between the first node N1 and the high-side node NH.

The second unidirectional conducting device 320 is coupled between the second node N2 and the high-side node NH. When the voltage of the second node N2 exceeds the high-side voltage VH, the second unidirectional conducting device 320 is turned ON. When the voltage of the second node N2 does not exceed the high-side voltage VH, the second unidirectional conducting device 320 is turned OFF.

The third unidirectional conducting device 330 is coupled between the driving node ND and the second node N2. When the driving voltage VD of the driving node ND exceeds the voltage of the second node N2, the third unidirectional conducting device 330 is turned ON. When the driving voltage VD does not exceed the voltage of the second node N2, the third unidirectional conducting device 330 is turned OFF.

The switch 340 receives the control signal SC and is coupled between the high-side node NH and the ground. In addition, the switch 340 is configured to couple the high-side node NH to the ground according to the control signal SC.

For the simplicity of illustration, the switch 340 is illustrated herein as an N-type transistor. According to an embodiment of the invention, when the control signal SC is at the high voltage level, such as the supply voltage VDD, the switch 340 is turned ON and the capacitor C is charged by the supply voltage VDD through the first unidirectional conducting device 310, the second unidirectional conducting device 320, and the switch 340 to the ground.

According to another embodiment of the invention, when the control signal SC is at the low voltage level, such as the ground level, the switch 340 is turned OFF and the third unidirectional conducting device 330 provides the driving voltage VD to the second node N2, such that the capacitor C is discharged to the driving node ND through the discharge resistor RD.

According to an embodiment of the invention, the resistance of the discharge resistor RD determines the maximum voltage that the capacitor C can be charged and also the maximum voltage that the high-side voltage VH can be achieved. In addition, the larger the resistance of the discharge resistor RD is, the lower the rising speed of the high-side voltage VD could be achieved. Therefore, there is a trade-off on the resistance of the discharge resistor RD.

According to an embodiment of the invention, each of the first unidirectional conducting device 310, the second unidirectional conducting device 320, and the third unidirectional conducting device 330 is a diode. According to another embodiment of the invention, each of the first unidirectional conducting device 310, the second unidirectional conducting device 320, and the third unidirectional conducting device 330 is a diode-connected normally-off transistor.

Figure 4:
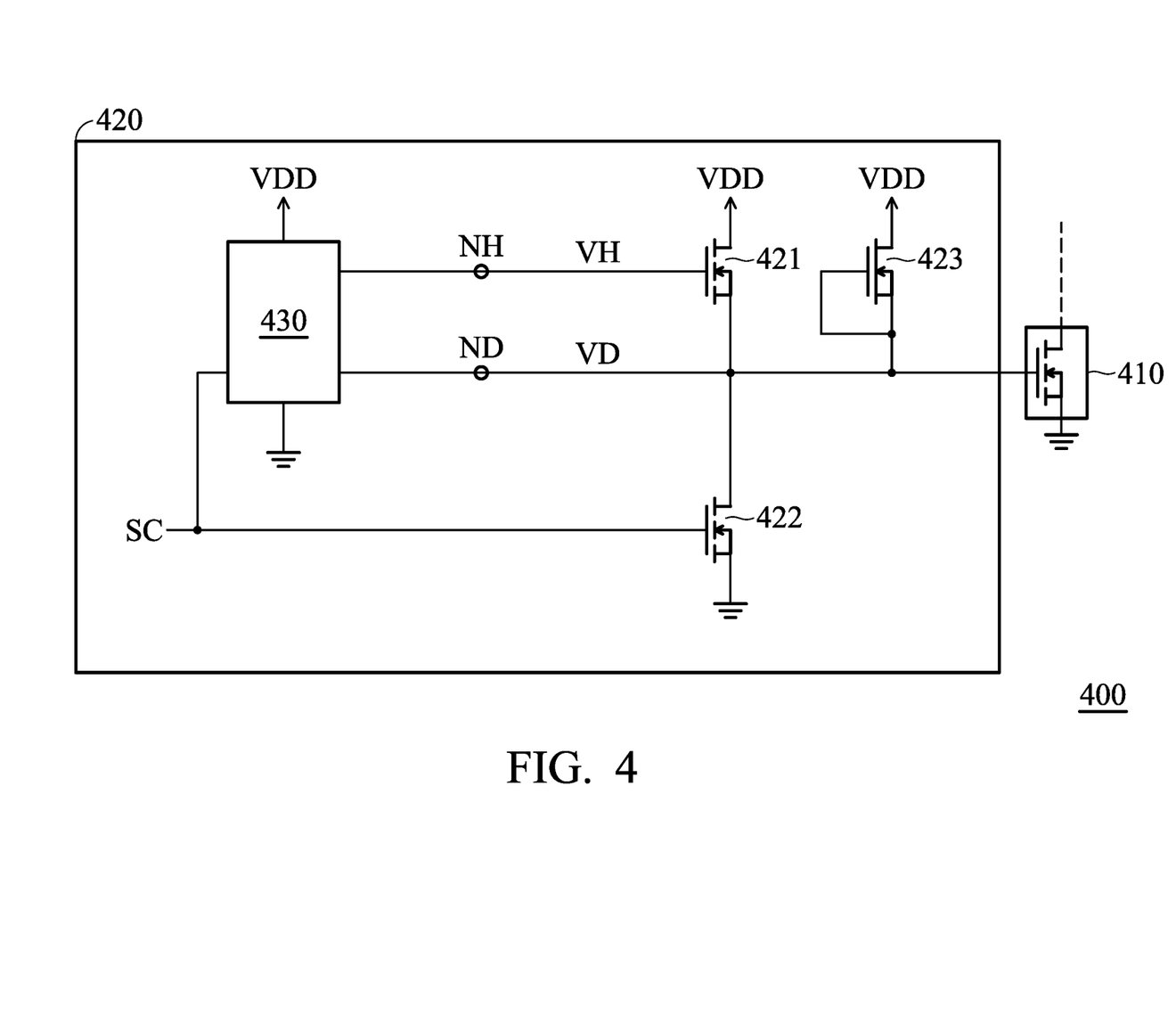
FIG. 4 shows a block diagram of a power circuit in accordance with another embodiment of the invention.

FIG. 4 shows a block diagram of a power circuit in accordance with another embodiment of the invention. As shown in FIG. 4, the power circuit 400 includes a power transistor 410 and a driving circuit 420, in which the power transistor 410 and the driving circuit 420 respectively correspond to the power transistor 210 and the driving circuit 220 in FIG. 2.

The driving circuit 420 further includes a high-side normally-on transistor 423. The source terminal and the gate terminal of the high-side normally-on transistor 423 are coupled to the driving node ND, and the drain terminal of the high-side normally-on transistor 423 is supplied by the supply voltage VDD. The high-side normally-on transistor 423 is always turned on to improve the driving capability of the high-side transistor 421.

Figure 5:
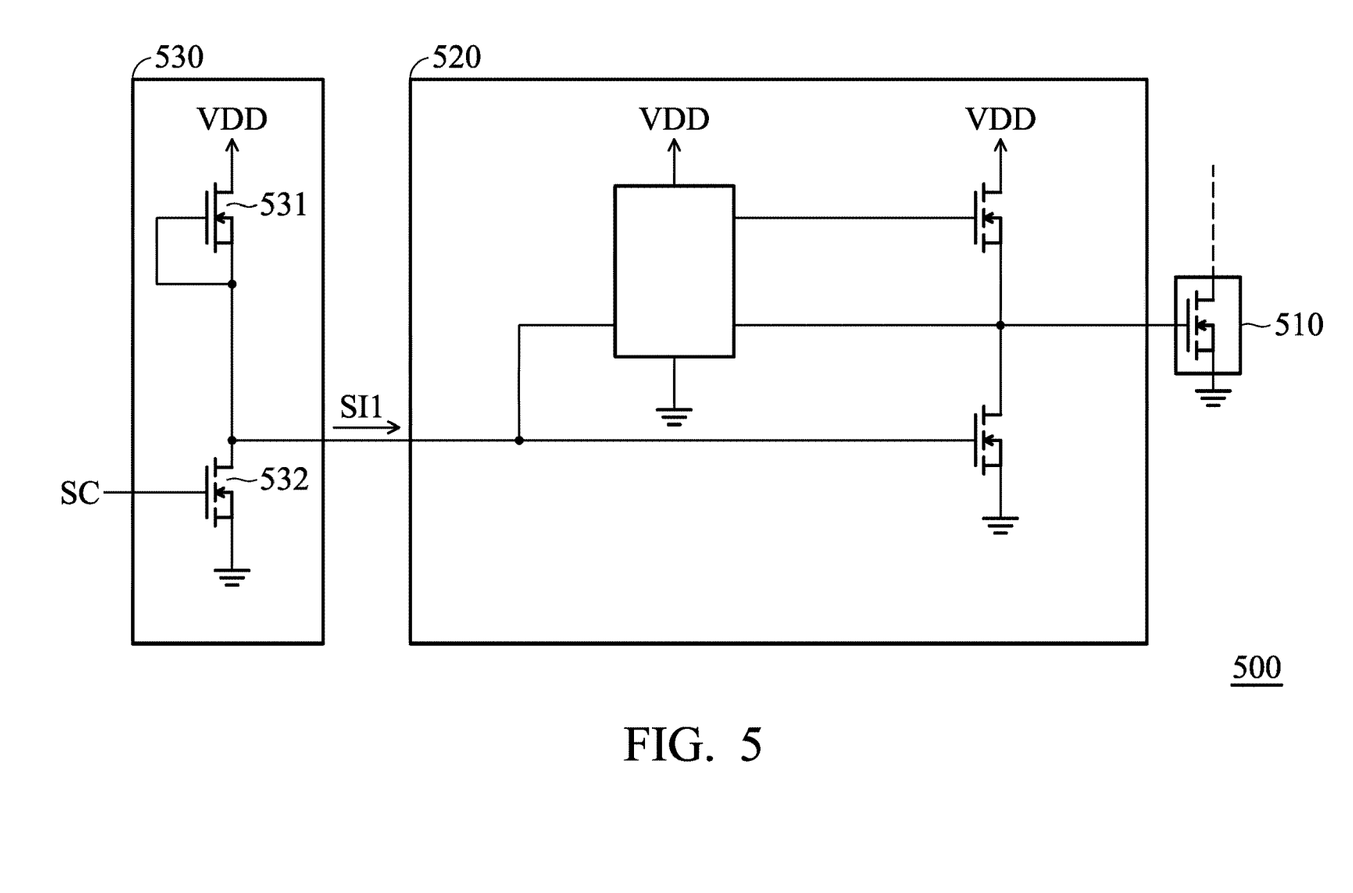
FIG. 5 shows a block diagram of a power circuit in accordance with yet another embodiment of the invention.

FIG. 5 shows a block diagram of a power circuit in accordance with yet another embodiment of the invention. As shown in FIG. 5, the power circuit 500 includes a power transistor 510, a driving circuit 520, and a first pre-driver 530, in which the power transistor 510 and the driving circuit 520 respectively correspond to the power transistor 210 and the driving circuit 220 in FIG. 2.

The first pre-driver 530 receives the control signal SC to generate the first internal signal SI1 to the driving circuit 520 for improving the driving capability of the control signal SC. The first pre-driver 530 includes a first normally-on transistor 531 and a first normally-off transistor 532.

The gate terminal and the source terminal of the first normally-on transistor 531 are coupled to the driving circuit 520, and the drain terminal of the first normally-on transistor 531 is supplied by the supply voltage VDD. The gate terminal of first normally-off transistor 532 receives the control signal SC, the source terminal of first normally-off transistor 532 is coupled to the ground, and the drain terminal of first normally-off transistor 532 is coupled to the driving circuit 520.

Figure 6:
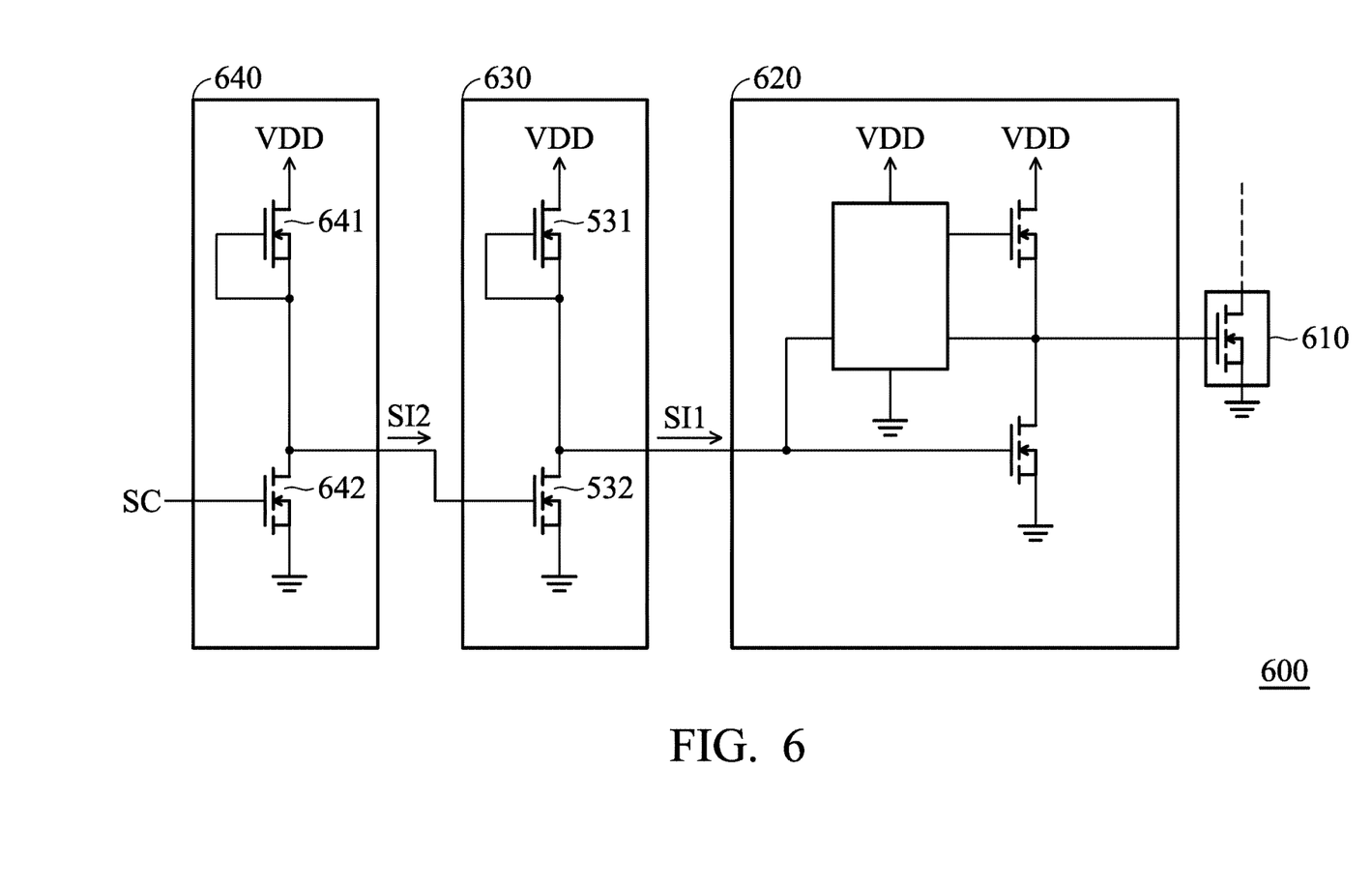
FIG. 6 shows a block diagram of a power circuit in accordance with yet another embodiment of the invention.

FIG. 6 shows a block diagram of a power circuit in accordance with yet another embodiment of the invention. As shown in FIG. 6, the power circuit 600 includes a power transistor 610, a driving circuit 620, a first pre-driver 630, and a second pre-driver 640, in which the power transistor 610, the driving circuit 620, and the first pre-driver 630 respectively correspond to the power transistor 510, the driving circuit 520, and the first pre-driver 530 in FIG. 5.

The second pre-driver 640 receives the control signal SC to generate the second internal signal SI2 to the first pre-driver 630 for further improving the driving capability of the control signal SC. The second pre-driver 640 includes a second normally-on transistor 641 and a second normally-off transistor 642.

The gate terminal and the source terminal of the second normally-on transistor 641 are coupled to the gate terminal of the first normally-off transistor 532 in the first pre-driver 630, and the drain terminal of the second normally-on transistor 641 is supplied by the supply voltage VDD. The gate terminal of the second normally-off transistor 642 receives the control signal SC, the source terminal of the second normally-off transistor 642 is coupled to the ground, and the drain terminal is coupled to the gate terminal of the first normally-off transistor 532 in the first pre-driver 630.

Figure 7:
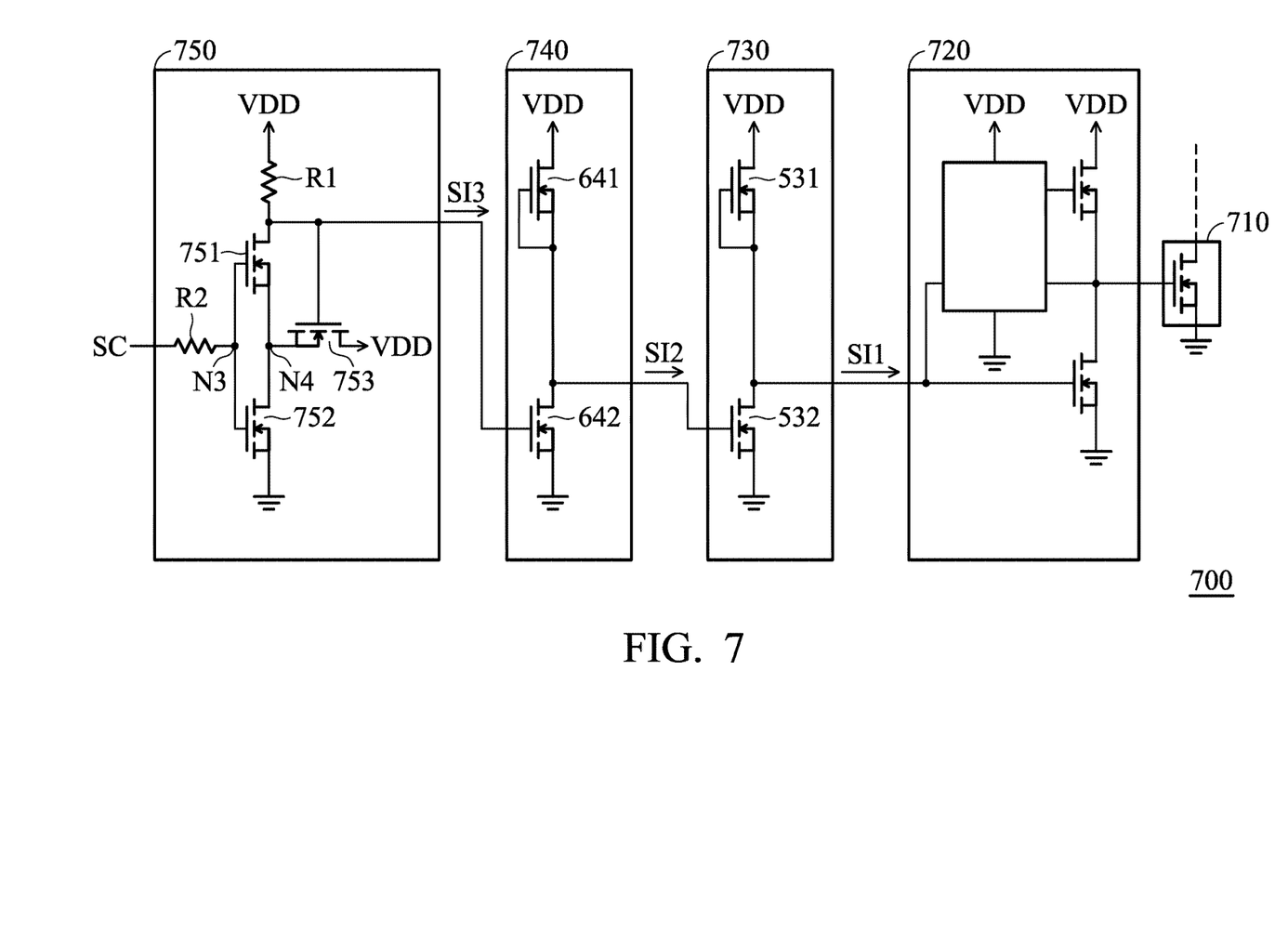
FIG. 7 shows a block diagram of a power circuit in accordance with yet another embodiment of the invention.

FIG. 7 shows a block diagram of a power circuit in accordance with yet another embodiment of the invention. As shown in FIG. 7, the power circuit 700 includes a power transistor 710, a driving circuit 720, a first pre-driver 730, a second pre-driver 740, and a hysteresis circuit 750, in which the power transistor 710, the driving circuit 720, the first pre-driver 730, and the second pre-driver 740 respectively correspond to the power transistor 610, the driving circuit 620, the first pre-driver 630, and the second pre-driver 640 in FIG. 6.

The hysteresis circuit 750 receives the control signal SC to generate the third internal signal SI3 to the second pre-driver 740 for further providing a hysteresis for the control signal SC. The hysteresis circuit 750 includes a first resistor R1, a third normally-off transistor 751, a fourth normally-off transistor 752, a fifth normally-off transistor 753, and a second resistor R2.

The first resistor is coupled between the supply voltage VDD and the gate terminal of the gate terminal of the second normally-off transistor 642 in the second pre-driver 740. The gate terminal of the third normally-off transistor 751 is coupled to a third node N3, the source terminal of the third normally-off transistor 751 is coupled to the fourth node N4, and the drain terminal of the third normally-off transistor 751 is coupled to the first resistor R1 and the gate terminal of the gate terminal of the second normally-off transistor 642 in the second pre-driver 740. The gate terminal of the fourth normally-off transistor 752 is coupled to the third node N3, the source terminal of the fourth normally-off transistor 752 is coupled to the ground, and the drain terminal of the fourth normally-off transistor 752 is coupled to the fourth node N4.

The gate terminal of the fifth normally-off transistor 753 is coupled to the first resistor R1 and the gate terminal of the gate terminal of the second normally-off transistor 642 in the second pre-driver 740, the source terminal of the fifth normally-off transistor 753 is coupled to the fourth node N4, and the drain terminal of the fifth normally-off transistor 753 is supplied by the supply voltage VDD. The second resistor R2 is coupled to the third node and receives the control signal SC.

Figure 8:
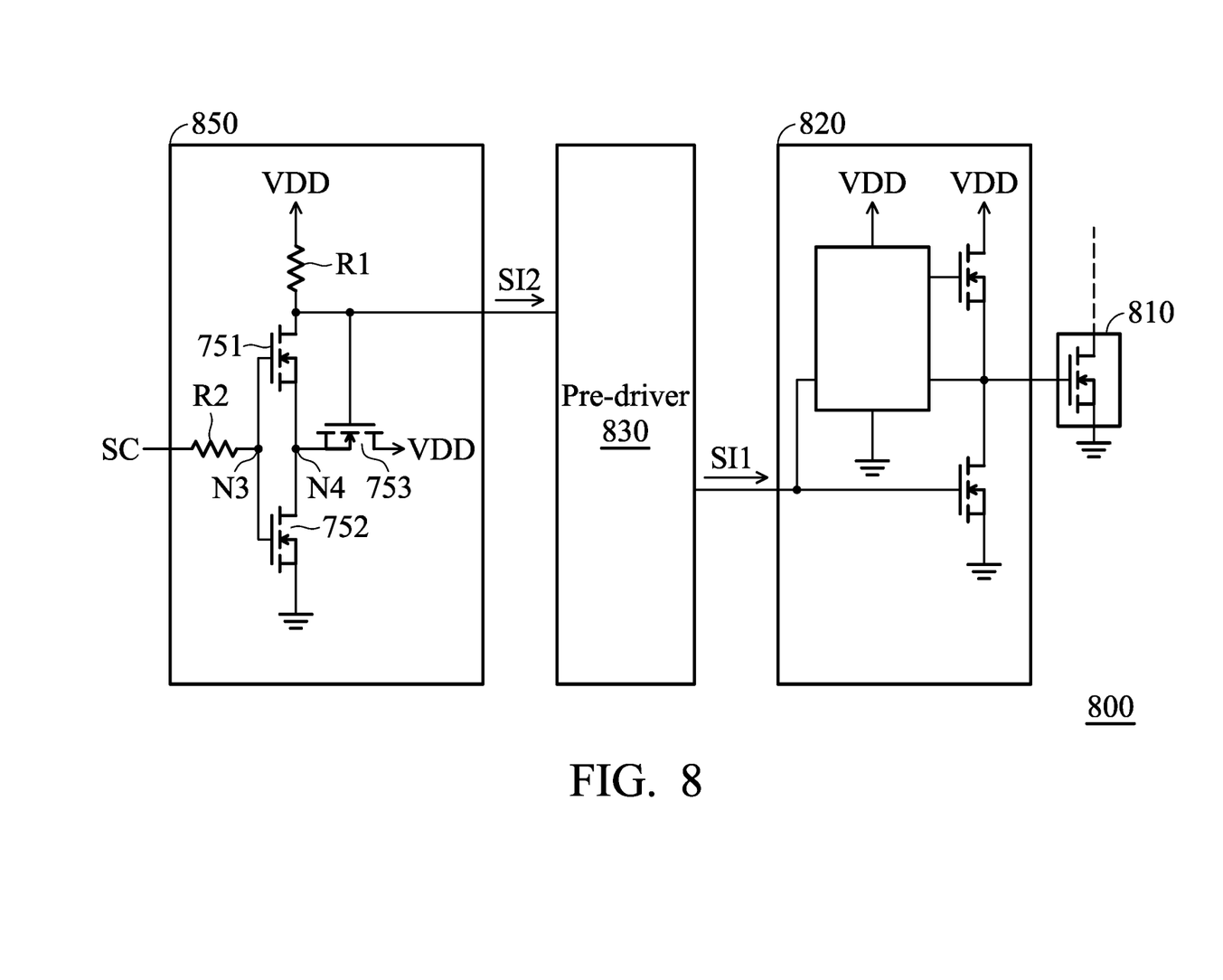
FIG. 8 shows a block diagram of a power circuit in accordance with yet another embodiment of the invention.

FIG. 8 shows a block diagram of a power circuit in accordance with yet another embodiment of the invention. As shown in FIG. 8, the power circuit 800 includes a power transistor 810, a driving circuit 820, a pre-driver 830, and a hysteresis circuit 850, in which the power transistor 810, the driving circuit 820, and the hysteresis circuit 850 respectively correspond to the power transistor 710, the driving circuit 720, and the hysteresis circuit 750 in FIG. 7.

According to an embodiment of the invention, the pre-driver 830 generates the first internal signal SI1 according to the second internal signal SI2 for improving the driving capability of the control signal SC. According to an embodiment of the invention, the first internal signal SI1 and the second internal signal SI2 are in-phase.

Figure 9:
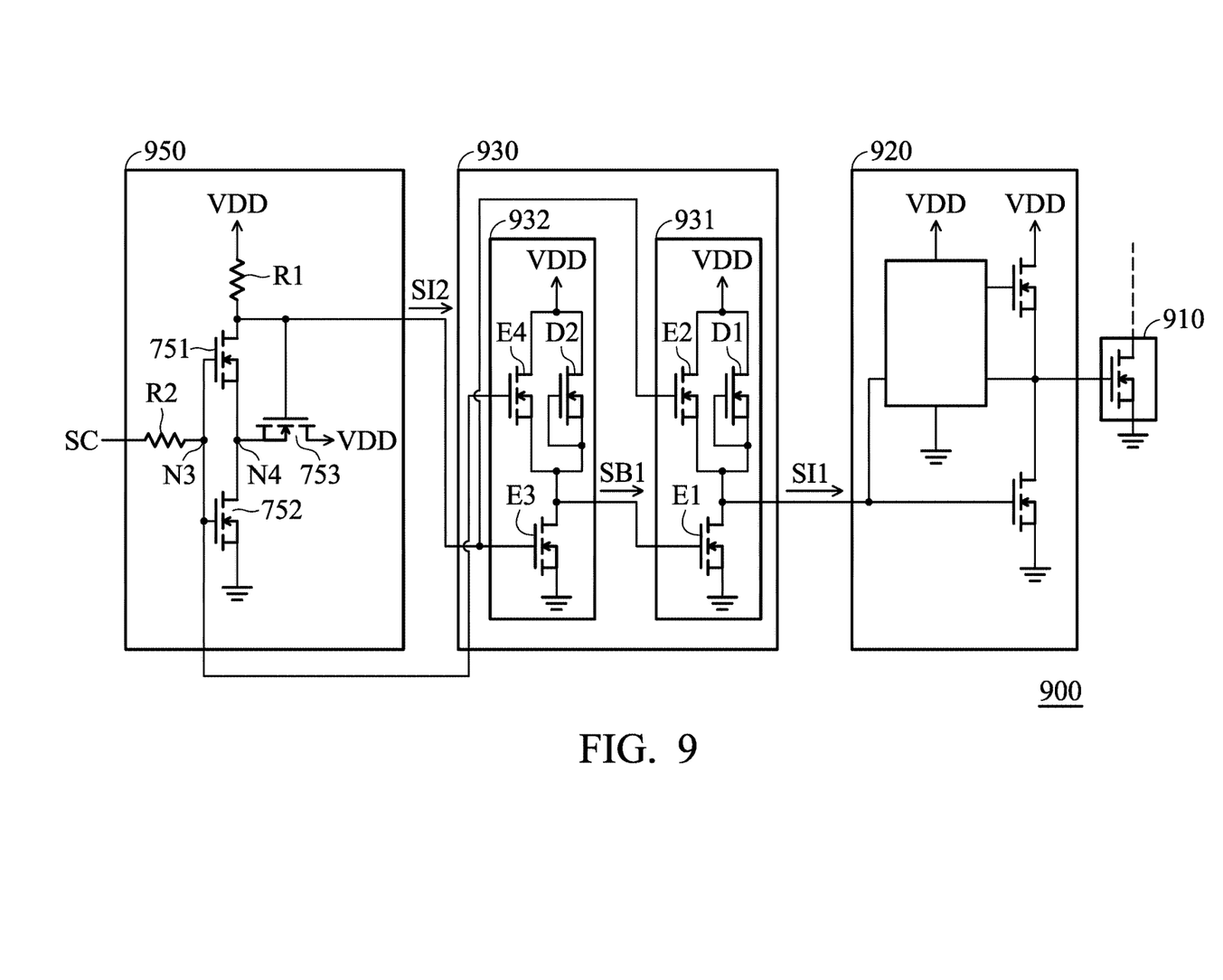
FIG. 9 shows a block diagram of a power circuit in accordance with yet another embodiment of the invention.

FIG. 9 shows a block diagram of a power circuit in accordance with yet another embodiment of the invention. As shown in FIG. 9, the power circuit 900 includes a power transistor 910, a driving circuit 920, a pre-driver 930, and a hysteresis circuit 950, in which the power transistor 910, the driving circuit 920, the pre-driver 930, and the hysteresis circuit 950 respectively correspond to the power transistor 810, the driving circuit 820, the pre-driver 830, and the hysteresis circuit 850 in FIG. 8.

As shown in FIG. 9, the pre-driver 930 includes a first sub pre-driver 931 and a second sub pre-driver 932. The first sub pre-driver 931 includes a first sub normally-off transistor E1, a second sub normally-off transistor E2, and a first sub normally-on transistor D1, in which the first sub pre-driver 931 generates the first internal signal SI1 according to a first sub-internal signal SB1.

The gate terminal of the first sub normally-off transistor E1 receives the first sub-internal signal SB1, and the source terminal of the first sub normally-off transistor E1 is coupled to the ground. The gate terminal of the second sub normally-off transistor E2 receives the second internal signal SI2. Namely, the gate terminal of the second sub normally-off transistor E2 is coupled to the gate terminal of the third sub normally-on transistor E3. The drain terminal of the second sub normally-off transistor E2 is supplied by the supply voltage VDD.

The source terminal of the second sub normally-off transistor E2 is coupled to the drain terminal of the first sub normally-off transistor E1, in which the drain terminal of the first sub normally-off transistor E1 generates the first internal signal SI1 to the driving circuit 920. The gate and source terminals of the first sub normally-on transistor D1 are coupled together. The drain terminal of the first sub normally-on transistor D1 is supplied by the supply voltage VDD.

The second sub pre-driver 932 includes a third sub normally-off transistor E3, a fourth sub normally-off transistor E4, and a second sub normally-on transistor D2, in which the second sub pre-driver 932 generates the first sub-internal signal SB1 according to the second internal signal SI2.

The gate terminal of the third sub normally-off transistor E3 receives the second internal signal SI2, and the source terminal of the third sub normally-off transistor E3 is coupled to the ground. The gate terminal of the fourth sub normally-off transistor E4 is coupled to the third node N3 in the hysteresis circuit 950. The drain terminal of the fourth sub normally-off transistor E4 is supplied by the supply voltage VDD.

The source terminal of the fourth sub normally-off transistor E4 is coupled to the drain terminal of the third sub normally-off transistor E3, in which the drain terminal of the third sub normally-off transistor E3 generates the first sub-internal signal SB1 to the first sub pre-driver 931. The gate and source terminals of the second sub normally-on transistor D2 are coupled together. The drain terminal of the second sub normally-on transistor D2 is supplied by the supply voltage VDD.

Figure 10:
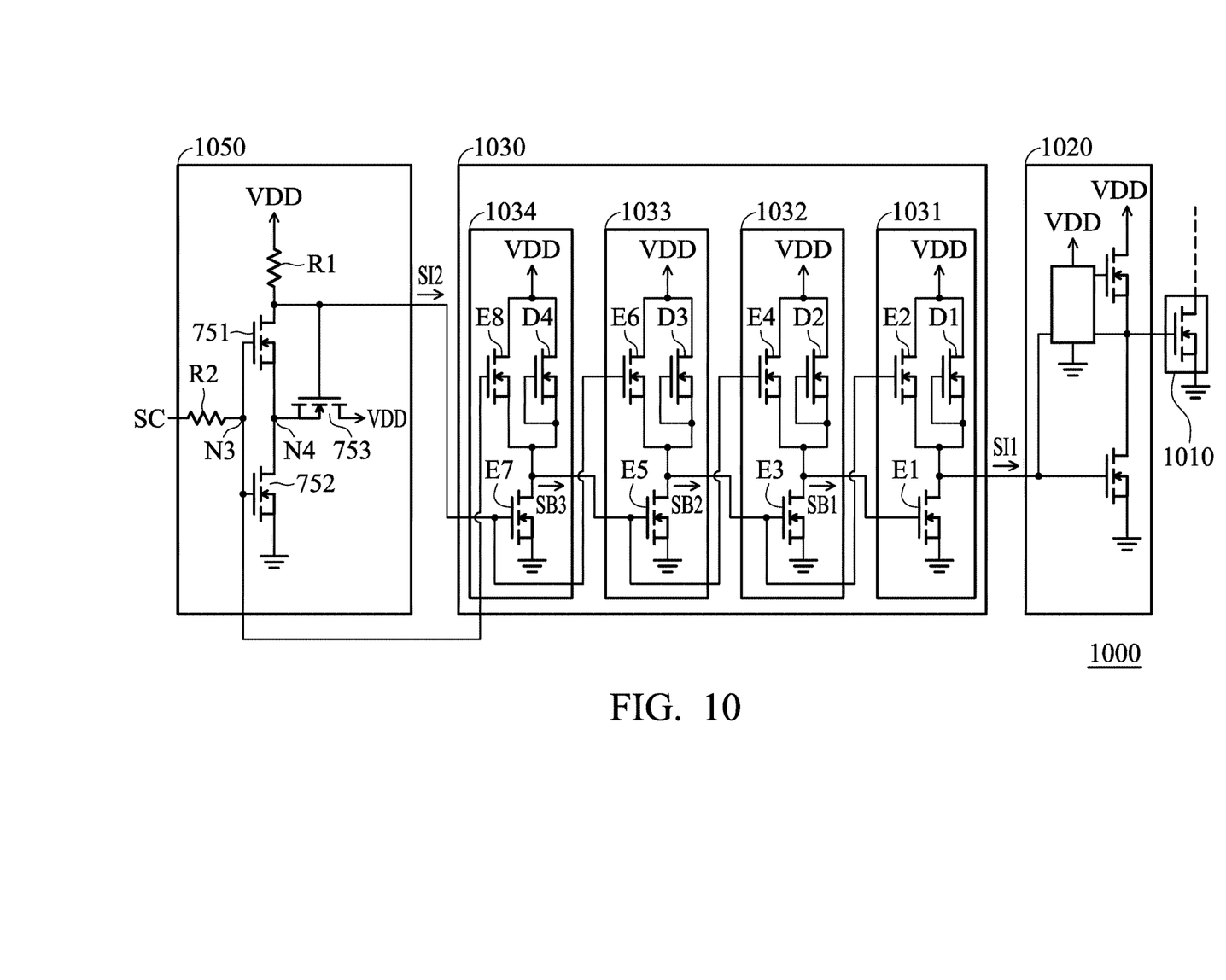
FIG. 10 shows a block diagram of a power circuit in accordance with yet another embodiment of the invention.

FIG. 10 shows a block diagram of a power circuit in accordance with yet another embodiment of the invention. As shown in FIG. 10, the power circuit 1000 includes a power transistor 1010, a driving circuit 1020, a pre-driver 1030, and a hysteresis circuit 1050, in which the power transistor 1010, the driving circuit 1020, the pre-driver 1030, and the hysteresis circuit 1050 respectively correspond to the power transistor 910, the driving circuit 920, the pre-driver 930, and the hysteresis circuit 950 in FIG. 9.

As shown in FIG. 10, the pre-driver 1030 includes a first sub pre-driver 1031, a second sub pre-driver 1032, a third sub pre-driver 1033, and a fourth sub pre-driver 1034, in which the first sub pre-driver 1031 and the second sub pre-driver 1032 respectively correspond to the first sub pre-driver 931 and the second sub pre-driver 932 in FIG. 9, which are not repeated herein.

The second sub pre-driver 1032 includes a third sub normally-off transistor E3, a fourth sub normally-off transistor E4, and a second sub normally-on transistor D2, in which the second sub pre-driver 1032 generates the first sub-internal signal SB1 according to the second sub-internal signal SB2.

The gate terminal of the third sub normally-off transistor E3 receives the second sub-internal signal SB2, and the source terminal of the third sub normally-off transistor E3 is coupled to the ground. The gate terminal of the fourth sub normally-off transistor E4 receives the third sub-internal signal SB3. The drain terminal of the fourth sub normally-off transistor E4 is supplied by the supply voltage VDD.

The source terminal of the fourth sub normally-off transistor E4 is coupled to the drain terminal of the third sub normally-off transistor E3, in which the drain terminal of the third sub normally-off transistor E3 generates the second sub-internal signal SB2 to the first sub pre-driver 1031. The gate and source terminals of the second sub normally-on transistor D2 are coupled together. The drain terminal of the second sub normally-on transistor D2 is supplied by the supply voltage VDD.

The third sub pre-driver 1033 includes a fifth sub normally-off transistor E5, a sixth sub normally-off transistor E6, and a third sub normally-on transistor D3, in which the third sub pre-driver 1033 generates the second sub-internal signal SB2 according to the third sub-internal signal SB3.

The gate terminal of the fifth sub normally-off transistor E5 receives the third sub-internal signal SB3, and the source terminal of the fifth sub normally-off transistor E5 is coupled to the ground. The gate terminal of the sixth sub normally-off transistor E6 receives the second internal signal SI2. The drain terminal of the sixth sub normally-off transistor E6 is supplied by the supply voltage VDD.

The source terminal of the sixth sub normally-off transistor E6 is coupled to the drain terminal of the fifth sub normally-off transistor E5, in which the drain terminal of the fifth sub normally-off transistor E5 generates the second sub-internal signal SB2 to the second sub pre-driver 1032. The gate and source terminals of the third sub normally-on transistor D3 are coupled together. The drain terminal of the third sub normally-on transistor D3 is supplied by the supply voltage VDD.

The fourth sub pre-driver 1034 includes a seventh sub normally-off transistor E7, a eighth sub normally-off transistor E8, and a fourth sub normally-on transistor D4, in which the fourth sub pre-driver 1034 generates the third sub-internal signal SB3 according to the second internal signal SI2.

The gate terminal of the seventh sub normally-off transistor E7 receives the second internal signal SI2, the source terminal of the seventh sub normally-off transistor E7 is coupled to the ground. The gate terminal of the eighth sub normally-off transistor E8 is coupled to the third node N3 in the hysteresis circuit 1050. The drain terminal of the eighth sub normally-off transistor E8 is supplied by the supply voltage VDD.

The source terminal of the eighth sub normally-off transistor E8 is coupled to the drain terminal of the seventh sub normally-off transistor E7, in which the drain terminal of the seventh sub normally-off transistor E7 generates the third sub-internal signal SB3 to the third sub pre-driver 1033. The gate and source terminals of the fourth sub normally-on transistor D4 are coupled together. The drain terminal of the fourth sub normally-on transistor D4 is supplied by the supply voltage VDD.

According to other embodiments of the invention, the pre-driver 830 in FIG. 8 may include an even number of the sub pre-drivers such that the first internal signal SI1 and the second internal signal SI2 are in-phase.

Since the capacitor of the charge pump is not charged through the power transistor, the high-side voltage VH can be kept steady and protected from interference.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:
1. A power circuit, comprising:
a power transistor, flowing a power current to a ground according to a driving voltage of a driving node; and
a driving circuit, comprising:
a high-side transistor, providing a supply voltage to the driving node according to a high-side voltage of a high-side node;
a low-side transistor, coupling the driving node to the ground according to a first internal signal; and
a charge pump, coupled to the high-side node and the driving node, wherein the charge pump is configured to generate a high-side voltage that exceeds the supply voltage according to the first internal signal; and
a pre-driver, generating the first internal signal according to a control signal, wherein the pre-driver is configured to improve driving capability of the control signal.
2. The power circuit of claim 1, further comprising:
a hysteresis circuit, coupled between the control signal and the pre-driver, wherein the hysteresis circuit receives the control signal to generate a second internal signal, such that the pre-driver generates the first internal signal according to the second internal signal, wherein the hysteresis circuit is configured to provide a hysteresis for the control signal.
3. The power circuit of claim 2, wherein the hysteresis circuit comprises:
a first resistor, coupled between the supply voltage and an output node, wherein the second internal signal is generated at the output node;

a third normally-off transistor, comprising a gate terminal coupled to a third node, a source terminal coupled to a fourth node, and a drain terminal coupled to the output node;

a fourth normally-off transistor, comprising a gate terminal coupled to the third node, a source terminal coupled to the ground, and a drain terminal coupled to the fourth node;

a fifth normally-off transistor, comprising a gate terminal coupled to the output node, a source terminal coupled to the fourth node, and a drain terminal supplied by the supply voltage; and a second resistor, coupled to the third node and receiving the control signal.

4. The power circuit of claim 3, wherein the pre-driver comprises:

a first sub pre-driver, generating the first internal signal according to a first sub-internal signal; and a second sub pre-driver, generating the first sub-internal signal according to the second internal signal.

5. The power circuit of claim 4, wherein the first sub pre-driver comprises:

a first sub normally-off transistor, comprising a gate terminal receiving the first sub-internal signal, a source terminal coupled to the ground, and a drain terminal generating the first internal signal;

a second sub normally-off transistor, comprising a gate terminal receiving the second internal signal, a source terminal coupled to the drain terminal of the first sub normally-off transistor, and a drain terminal supplied by the supply voltage; and a first sub normally-on transistor, comprising a gate terminal coupled to the drain terminal of the first sub normally-off transistor, a source terminal coupled to the drain terminal of the first sub normally-off transistor, and a drain terminal supplied by the supply voltage.

6. The power circuit of claim 5, wherein the second sub pre-driver comprises:

a third sub normally-off transistor, comprising a gate terminal receiving the second internal signal, a source terminal coupled to the ground, and a drain terminal generating the first sub-internal signal;

a fourth sub normally-off transistor, comprising a gate terminal coupled to the third node of the hysteresis circuit, a source terminal coupled to the drain terminal of the third sub normally-off transistor, and a drain terminal supplied by the supply voltage; and a second sub normally-on transistor, comprising a gate terminal coupled to the drain terminal of the third sub normally-off transistor, a source terminal coupled to the drain terminal of the third sub normally-off transistor, and a drain terminal supplied by the supply voltage.

7. The power circuit of claim 5, wherein the pre-driver further comprises:

a third sub pre-driver, generating a second sub-internal signal according to a third sub-internal signal such that the second sub pre-driver generates the first sub-internal signal according to the second sub-internal signal; and a fourth sub pre-driver, generating the third sub-internal signal according to the second internal signal.

8. The power circuit of claim 7, wherein the second sub pre-driver comprises:

a third sub normally-off transistor, comprising a gate terminal receiving the second sub-internal signal, a source terminal coupled to the ground, and a drain terminal generating the first sub-internal signal;

a fourth sub normally-off transistor, comprising a gate terminal receiving the third sub-internal signal, a source terminal coupled to the drain terminal of the third sub normally-off transistor, and a drain terminal supplied by the supply voltage; and a second sub normally-on transistor, comprising a gate terminal coupled to the drain terminal of the third sub normally-off transistor, a source terminal coupled to the drain terminal of the third sub normally-off transistor, and a drain terminal supplied by the supply voltage.

9. The power circuit of claim 8, wherein the third sub pre-driver comprises:

a fifth sub normally-off transistor, comprising a gate terminal receiving the third sub-internal signal, a source terminal coupled to the ground, and a drain terminal generating the second sub-internal signal;

a sixth sub normally-off transistor, comprising a gate terminal receiving the second internal signal, a source terminal coupled to the drain terminal of the fifth sub normally-off transistor, and a drain terminal supplied by the supply voltage; and a third sub normally-on transistor, comprising a gate terminal coupled to the drain terminal of the fifth sub normally-off transistor, a source terminal coupled to the drain terminal of the fifth sub normally-off transistor, and a drain terminal supplied by the supply voltage.

10. The power circuit of claim 9, wherein the fourth sub pre-driver comprises:

a seventh sub normally-off transistor, comprising a gate terminal receiving the second internal signal, a source terminal coupled to the ground, and a drain terminal generating the third sub-internal signal;

a eighth sub normally-off transistor, comprising a gate terminal coupled to the third node of the hysteresis circuit, a source terminal coupled to the drain terminal of the seventh sub normally-off transistor, and a drain terminal supplied by the supply voltage; and a fourth sub normally-on transistor, comprising a gate terminal coupled to the drain terminal of the seventh sub normally-off transistor, a source terminal coupled to the drain terminal of the seventh sub normally-off transistor, and a drain terminal supplied by the supply voltage.

11. The power circuit of claim 1, wherein the high-side transistor and the low-side transistor are normally-off transistors.

12. The power circuit of claim 1, wherein the power transistor is a GaN transistor.

13. The power circuit of claim 1, wherein the charge pump comprises:

a first unidirectional conducting device, unidirectionally providing the supply voltage to a first node;

a capacitor, coupled between the first node and a second node;

a discharge resistor, coupled between the first node and the high-side node;

a second unidirectional conducting device, unidirectionally coupling the second node to the high-side node when a voltage of the second node exceeds a voltage of the high-side node;

a third unidirectional conducting device, unidirectionally providing the driving voltage to the second node when the driving voltage exceeds the voltage of the second node; and a switch, receiving the first internal signal and configured to couple the high-side node to the ground according to the first internal signal.

14. The power circuit of claim 13, wherein, when the control signal is at a high voltage level, the switch is turned ON and the capacitor is charged by the supply voltage through the first unidirectional conducting device, the second unidirectional conducting device, and the switch, wherein, when the control signal is at a low voltage level, the switch is turned OFF, the third unidirectional conducting device provides the driving voltage to the second node, and the capacitor is discharged to the high-side node through the discharge resistor.

15. The power circuit of claim 13, wherein each of the first unidirectional conducting device, the second unidirectional conducting device, and the third unidirectional conducting device is a diode or a diode-connected normally-off transistor.

16. The power circuit of claim 1, wherein the driving circuit further comprises:
a high-side normally-on transistor, comprising a source terminal coupled to the driving node, a gate terminal coupled to the driving node, and a drain terminal supplied by the supply voltage, wherein the high-side normally-on transistor is configured to improve driving capability of the high-side transistor.

17. The power circuit of claim 1, wherein the driving circuit is a rail-to-rail driver, such that the driving voltage ranges from the supply voltage to the ground.

18. A driving circuit for driving a power transistor, wherein the power transistor flows a power current to a ground according to a driving voltage of a driving node, the driving circuit comprising:
a high-side transistor, providing a supply voltage to the driving node according to a high-side voltage of a high-side node;
a low-side transistor, coupling the driving node to the ground according to a first internal signal; and
a charge pump, coupled to the high-side node and the driving node, wherein the charge pump is configured to generate a high-side voltage that exceeds the supply voltage according to the first internal signal; and
a pre-driver, generating the first internal signal according to a control signal, wherein the pre-driver is configured to improve driving capability of the control signal.

19. The driving circuit of claim 18, further comprising:
a hysteresis circuit, coupled between the control signal and the pre-driver, wherein the hysteresis circuit receives the control signal to generate a second internal signal, such that the pre-driver generates the first internal signal according to the second intern al signal, wherein the hysteresis circuit is configured to provide a hysteresis function for the control signal.

20. The driving circuit of claim 19, wherein the hysteresis circuit comprises:
a first resistor, coupled between the supply voltage and an output node, wherein the second internal signal is generated at the output node;
a third normally-off transistor, comprising a gate terminal coupled to a third node, a source terminal coupled to a fourth node, and a drain terminal coupled to the output node;
a fourth normally-off transistor, comprising a gate terminal coupled to the third node, a source terminal coupled to the ground, and a drain terminal coupled to the fourth node;
a fifth normally-off transistor, comprising a gate terminal coupled to the output node, a source terminal coupled to the fourth node, and a drain terminal supplied by the supply voltage; and
a second resistor, coupled to the third node and receiving the control signal.

21. The driving circuit of claim 20, wherein the pre-driver comprises:
a first sub pre-driver, generating the first internal signal according to a first sub-internal signal; and
a second sub pre-driver, generating the first sub-internal signal according to the second internal signal.

22. The driving circuit of claim 21, wherein the first sub pre-driver comprises:
a first sub normally-off transistor, comprising a gate terminal receiving the first sub-internal signal, a source terminal coupled to the ground, and a drain terminal generating the first internal signal;
a second sub normally-off transistor, comprising a gate terminal receiving the second internal signal, a source terminal coupled to the drain terminal of the first sub normally-off transistor, and a drain terminal supplied by the supply voltage; and
a first sub normally-on transistor, comprising a gate terminal coupled to the drain terminal of the first sub normally-off transistor, a source terminal coupled to the drain terminal of the first sub normally-off transistor, and a drain terminal supplied by the supply voltage.

23. The driving circuit of claim 22, wherein the second sub pre-driver comprises:
a third sub normally-off transistor, comprising a gate terminal receiving the second internal signal, a source terminal coupled to the ground, and a drain terminal generating the first sub-internal signal;
a fourth sub normally-off transistor, comprising a gate terminal coupled to the third node of the hysteresis circuit, a source terminal coupled to the drain terminal of the third sub normally-off transistor, and a drain terminal supplied by the supply voltage; and
a second sub normally-on transistor, comprising a gate terminal coupled to the drain terminal of the third sub normally-off transistor, a source terminal coupled to the drain terminal of the third sub normally-off transistor, and a drain terminal supplied by the supply voltage.

24. The driving circuit of claim 22, wherein the pre-driver further comprises:
a third sub pre-driver, generating a second sub-internal signal according to a 4 third sub-internal signal such that the second sub pre-driver generates the first sub-internal signal according to the second sub-internal signal; and
a fourth sub pre-driver, generating the third sub-internal signal according to the second internal signal.

25. The driving circuit of claim 24, wherein the second sub pre-driver comprises:
a third sub normally-off transistor, comprising a gate terminal receiving the second sub-internal signal, a source terminal coupled to the ground, and a drain terminal generating the first sub-internal signal;
a fourth sub normally-off transistor, comprising a gate terminal receiving the third sub-internal signal, a source terminal coupled to the drain terminal of the third sub normally-off transistor, and a drain terminal supplied by the supply voltage; and
a second sub normally-on transistor, comprising a gate terminal coupled to the drain terminal of the third sub normally-off transistor, a source terminal coupled to the drain terminal of the third sub normally-off transistor, and a drain terminal supplied by the supply voltage.

26. The driving circuit of claim 25, wherein the third sub pre-driver comprises:

a fifth sub normally-off transistor, comprising a gate terminal receiving the third sub-internal signal, a source terminal coupled to the ground, and a drain terminal generating the second sub-internal signal;

a sixth sub normally-off transistor, comprising a gate terminal receiving the second internal signal, a source terminal coupled to the drain terminal of the fifth sub normally-off transistor, and a drain terminal supplied by the supply voltage; and a third sub normally-on transistor, comprising a gate terminal coupled to the drain terminal of the fifth sub normally-off transistor, a source terminal coupled to the drain terminal of the fifth sub normally-off transistor, and a drain terminal supplied by the supply voltage.

27. The driving circuit of claim 26, wherein the fourth sub pre-driver comprises:

a seventh sub normally-off transistor, comprising a gate terminal receiving the second internal signal, a source terminal coupled to the ground, and a drain terminal generating the third sub-internal signal;

a eighth sub normally-off transistor, comprising a gate terminal coupled to the third node of the hysteresis circuit, a source terminal coupled to the drain terminal of the seventh sub normally-off transistor, and a drain terminal supplied by the supply voltage; and a fourth sub normally-on transistor, comprising a gate terminal coupled to the drain terminal of the seventh sub normally-off transistor, a source terminal coupled to the drain terminal of the seventh sub normally-off transistor, and a drain terminal supplied by the supply voltage.

28. The driving circuit of claim 18, wherein the high-side transistor and the low-side transistor are normally-off transistors.

29. The driving circuit of claim 18, wherein the power transistor is a GaN transistor.

30. The driving circuit of claim 18, wherein the charge pump comprises:

a first unidirectional conducting device, unidirectionally providing the supply voltage to a first node;

a capacitor, coupled between the first node and a second node;

a discharge resistor, coupled between the first node and the high-side node;

a second unidirectional conducting device, unidirectionally coupling the second node to the high-side node when a voltage of the second node 8 exceeds a voltage of the high-side node;

a third unidirectional conducting device, unidirectionally providing the driving voltage to the second node when the driving voltage exceeds the voltage of the second node; and a switch, receiving the first internal signal and configured to couple the high-side node to the ground according to the first internal signal.

31. The driving circuit of claim 30, wherein, when the control signal is at a high voltage level, the switch is turned ON and the capacitor is charged by the supply voltage through the first unidirectional conducting device, the second unidirectional conducting device, and the switch, wherein, when the control signal is at a low voltage level, the switch is turned OFF, the third unidirectional conducting device provides the driving voltage to the second node, and the capacitor is discharged to the high-side node through the discharge resistor.

32. The driving circuit of claim 30, wherein each of the first unidirectional conducting device, the second unidirectional conducting device, and the third unidirectional conducting device is a diode or a diode-connected normally-off transistor.

33. The driving circuit of claim 18, further comprising:

a high-side normally-on transistor, comprising a source terminal coupled to the driving node, a gate terminal coupled to the driving node, and a drain terminal supplied by the supply voltage, wherein the high-side normally-on transistor is configured to improve driving capability of the high-side transistor.

34. The driving circuit of claim 18, wherein the driving circuit is a rail-to-rail driver, such that the driving voltage ranges from the supply voltage to the ground.

* * * * *